United States Patent [19]

Hasegawa et al.

[11] Patent Number: 5,396,335
[45] Date of Patent: Mar. 7, 1995

[54] POSITION DETECTING METHOD

[75] Inventors: Masanobu Hasegawa, Atsugi; Kenji Saitoh; Shigeyuki Suda, both of Yokohama, all of Japan

[73] Assignee: Canon Kabushiki Kaisha, Tokyo, Japan

[21] Appl. No.: 800,271

[22] Filed: Dec. 2, 1991

[30] Foreign Application Priority Data

Nov. 30, 1990 [JP] Japan .................................. 2-339905

[51] Int. Cl.⁶ .............................................. G01B 11/00
[52] U.S. Cl. .................................................... 356/401
[58] Field of Search ................................. 356/399–401; 250/548; 355/43, 53

[56] References Cited

U.S. PATENT DOCUMENTS

| | | | |
|---|---|---|---|
| 4,037,969 | 7/1977 | Feldman et al. | 356/172 |
| 4,311,389 | 1/1982 | Fay et al. | 356/354 |
| 4,801,808 | 1/1989 | Hamasaki | 356/401 X |
| 5,026,239 | 6/1991 | Chiba et al. | 414/217 |
| 5,114,236 | 5/1992 | Matsugu et al. | 356/401 X |
| 5,200,800 | 4/1993 | Suda et al. | 356/401 |

FOREIGN PATENT DOCUMENTS

| | | |
|---|---|---|
| 0336537 | 10/1989 | European Pat. Off. . |
| 0358425 | 3/1990 | European Pat. Off. . |
| 56-157033 | 12/1981 | Japan . |
| 62-261003 | 11/1987 | Japan . |

*Primary Examiner*—Richard A. Rosenberger
*Assistant Examiner*—K. P. Hantis
*Attorney, Agent, or Firm*—Fitzpatrick, Cella, Harper & Scinto

[57] ABSTRACT

A method of detecting a positional deviation between a mask and a wafer, wherein a radiation beam having a predetermined intensity distribution is projected to an alignment pattern of the mask whereby a signal beam is produced, and wherein the positional deviation of the mask and the wafer is determined on the basis of the signal beam. The improvements reside in detecting a deviation of the position of incidence of the radiation beam upon the mask from a predetermined position, on the basis of the signal beam; relatively positioning the radiation beam and the mask so as to substantially correct the detected deviation; and determining the positional deviation of the mask and the wafer by using the relatively positioned radiation beam.

12 Claims, 7 Drawing Sheets

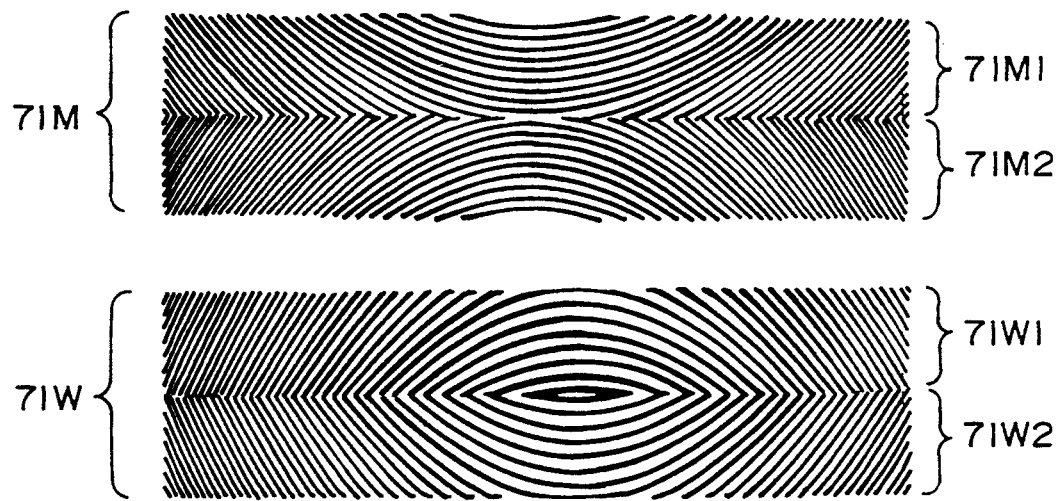
F I G. 8
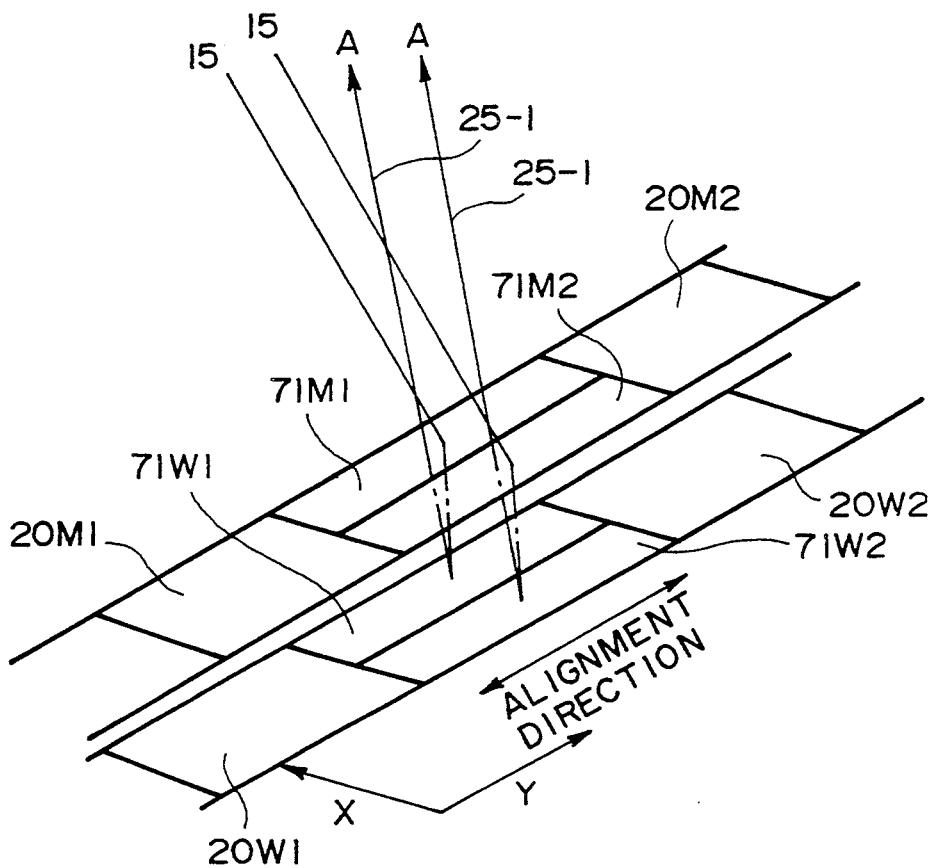
F I G. 9

POSITION DETECTING METHOD

FIELD OF THE INVENTION AND RELATED ART

This invention relates generally to an alignment system for correctly positioning an object. More particularly, the invention is concerned with a position detecting method suitably usable in a semiconductor microcircuit device manufacturing exposure apparatus for lithographically transferring a fine electronic circuit pattern formed on the surface of a first object (original) such as a mask or reticle (hereinafter referred to simply as a "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor with respect to ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" or "alignment marks" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. No. 4,037,969 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

U.S. Pat. No. 4,311,389 shows an arrangement wherein a mask is equipped with an alignment pattern having an optical function, for diffraction light, like a cylindrical lens while a wafter is equipped with an alignment pattern of dot array with which the light quantity of diffraction light of a predetermined order or orders from the pattern becomes maximum as the mask and the wafer are in correct alignment with each other, and wherein the relative position of the mask and the wafer is detected by detecting the light influenced by these alignment patterns.

European Patent Application No. 0,336,537A1 shows an arrangement wherein, for detection of relative positional deviation between a first object (mask) and a second object (wafer), each of the first and second objects is equipped with a pair of physical optic elements (alignment marks) each having a lens function. Light is projected to these physical optic elements from a light projecting means, including a laser, and a pair of diffraction lights as diffracted by these physical optic elements, respectively, are directed to a sensor (detecting means). By detecting the relative spacing between two light spots formed by the pair of diffraction lights upon the sensor surface, the relative positional deviation of the first and second objects is detected.

Here, the light projecting means as well as a detecting means, for receiving the lights diffracted by the two sets of physical optic elements, respectively, provided on the first and second objects, are accommodated in one casing.

Generally, a scribe line on a mask or a wafer, on which an alignment mark is to be provided, has a width of about 50-100 microns. This scribe line width corresponds, in a stepper of a projection magnification of 1:5, to a width of 250-500 microns on a reticle surface, and it corresponds in a unit-magnification contact or proximity X-ray exposure apparatus to a width of 50-100 microns. Each alignment mark is provided so as to be included in an area of this width. Thus, each alignment pattern is provided within the scribe line width.

In order to assure that light (light beam) is projected with a good efficiency from an alignment optical head (light projecting means) to an alignment pattern provided in such a small area, it is necessary to restrict the light beam diameter to a size corresponding to that of the alignment pattern. Further, as regards the manner of light projection, it is necessary that the light is projected correctly to the position of the alignment pattern.

Generally, if the light is projected incorrectly to the alignment pattern, the quantity of light (signal light) to be detected by a sensor decreases accordingly. If the light beam diameter is sufficiently large relative to the size of the alignment pattern, a small deviation of the light with respect to the alignment pattern will be allowed.

However, if the light is projected to a circuit pattern area, other than the alignment pattern area, there occurs unwanted scattered light (noise) from the circuit pattern. In order to avoid this, it is still necessary that the alignment pattern is irradiated with the light of an appropriate size corresponding to the size of the alignment pattern.

Generally, if the light beam diameter is restricted, the light quantity distribution upon the alignment pattern surface on a mask (reticle) becomes non-uniform.

Further, if the position of incidence of the light upon the alignment pattern shifts largely, in an arrangement such as disclosed in the aforementioned European Patent Application, the position of a spot of diffraction light as attainable from the alignment pattern, (i.e. mask-to-wafer deviation information) on an occasion when a small deviation is present between the mask and the wafer, displaces as compared with that on an occasion when the position of incidence of the light upon the alignment pattern is not shifted. Namely, the shift of the position of incidence of the light upon the alignment pattern causes an error in the alignment detection (detection of the mask-to-wafer deviation).

Generally, when a laser is used as a light source, the intensity distribution of a projected light beam from an optical head has a Gaussian form such as shown in FIG. 1, as having two symmetrical axes Ix and Iy. The projected light beam is so set that it is approximately a plane wave as it impinges on an alignment mark (pattern). Here, the radius of the light beam in the X or Y direction in which the intensity decreases to $e^{-2}$, for example, is denoted by Wx or Wy. In FIG. 1, numeral 100 denotes a laser, numeral 14 denotes a collimator lens and a character L denotes the light beam.

Here, if the beam radius Wx or Wy is made sufficiently large to cover the alignment mark, with a lowered precision of the relative alignment of the projected light beam and the alignment mark, the intensity distribution of the light impinging on the alignment mark does not easily change. As a result, the spacing between the gravity center positions of the two light spots on the sensor does not easily change and, therefore, the stability increases. However, the efficiency of using the projected light beam (energy) decreases and, therefore, there arise problems such as a decrease in the signal intensity, an increase in the noise component and the like.

If, to the contrary, the light beam diameter is made small, the signal-to-noise ratio increases. However, since the intensity distribution upon the alignment mark surface becomes non-uniform, any change in the relative position of the projected light beam and the alignment mark causes a change in the intensity distribution of an image as formed by the alignment mark of the mask. As a result, the spacing of the gravity centers of the two light spots on the sensor, formed through the enlarging image formation of that image, changes and the precision decreases.

It is seen therefrom that if the precision of the relative positioning of the projected light beam (i.e. the optical head or light projecting means) and the alignment mark (first or second object) is enhanced and an appropriate diameter of the projected light beam is adopted, the position detecting precision as well as the alignment precision can be enhanced.

However, if the positioning precision for the incidence of the projected light beam upon the alignment mark surface is to be improved only by a mechanical system, the structure becomes bulky and complicated and, as a result, there arises a problem of difficulty in maintaining the stability for a long time period.

SUMMARY OF THE INVENTION

It is accordingly an object of the present invention to provide a position detecting method by which high-precision position detection is attainable.

It is another object of the present invention to provide a method of manufacturing semiconductor devices, using such a position detecting method.

In accordance with a first aspect of the present invention, to achieve at least one of these objects, there is provided a method of detecting a positional deviation between a mask and a wafer, wherein a radiation beam having a predetermined intensity distribution is projected to an alignment pattern of the mask whereby a signal beam is produced, and wherein the positional deviation of the mask and the wafer is determined on the basis of the signal beam, the improvements residing in the steps of: detecting a deviation of the position of incidence of the radiation beam upon the mask from a predetermined position, on the basis of the signal beam; relatively positioning the radiation beam and the mask so as to substantially correct the detected deviation; and determining the positional deviation of the mask and the wafer by using the relatively positioned radiation beam.

In accordance with a second aspect of the present invention, there is provided a method of detecting a positional deviation between a mask with first and second patterns each having an optical power and a wafer with first and second marks each having an optical power, wherein a radiation beam having a predetermined intensity distribution is projected from an optical head to the mask such that a first beam influenced by the optical power of the first pattern and that of the first mark and a second beam influenced by the optical power of the second pattern and that of the second mark are produced and wherein the positional deviation is determined on the basis of a positional relationship between the first and second beams upon a predetermined plane, the improvements residing in the steps of: comparing intensity distributions of the first and second beams upon the predetermined plane with each other to detect a deviation of the position of incidence of the radiation beam upon the mask from a predetermined position; relatively positioning the radiation beam and the mask so as to substantially correct the detected deviation; and determining the positional deviation of the mask and the wafer by using the relatively positioned radiation beam.

In accordance with a third aspect of the present invention, there is provided a semiconductor device manufacturing method usable with a mask and a wafer, wherein the mask is formed with a circuit pattern and with first and second patterns each having an optical power, wherein a radiation beam having a predetermined intensity distribution is projected from an optical head obliquely to a surface of the wafer through the mask such that a first beam reflected by the wafer and influenced by the optical power of the first pattern and a second beam reflected by the wafer and influenced by the optical power of the second pattern are produced, wherein a spacing between the mask and the wafer is determined on the basis of a positional relationship between the first and second beams upon a predetermined plane, and wherein after adjusting the spacing the wafer is exposed to the circuit pattern of the mask, the improvements residing in the steps of: comparing intensity distributions of the first and second beams upon the predetermined plane with each other to detect a deviation of the position of incidence of the radiation beam upon the mask from a predetermined position; relatively positioning the radiation beam and the mask so as to substantially correct the detected deviation; and determining the spacing of the mask and the wafer by using the relatively positioned radiation beam.

In the second or third aspect of the present invention as described above, the first and second beams may be compared with each other with respect to the shape of the intensity distribution to thereby detect the deviation of the position of incidence, and the radiation beam may be relatively positioned so as to provide geometrically similar or symmetrical intensity distributions of the first and second beams. Alternatively, the first and second beams may be compared with each other with respect to an integrated intensity of the intensity distribution to thereby detect the deviation of the position of incidence, and the radiation beam may be relatively positioned so as to provide a predetermined ratio to the integrated intensities of the first and second beams.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 8 is an enlarged plan view schematically showing another example of alignment marks, usable with the present invention.

FIG. 9 is a schematic view for explaining mark disposition on a mask and a wafer, using the FIG. 8 example.

DESCRIPTION OF THE PREFERRED EMBODIMENTS

Figure 1:
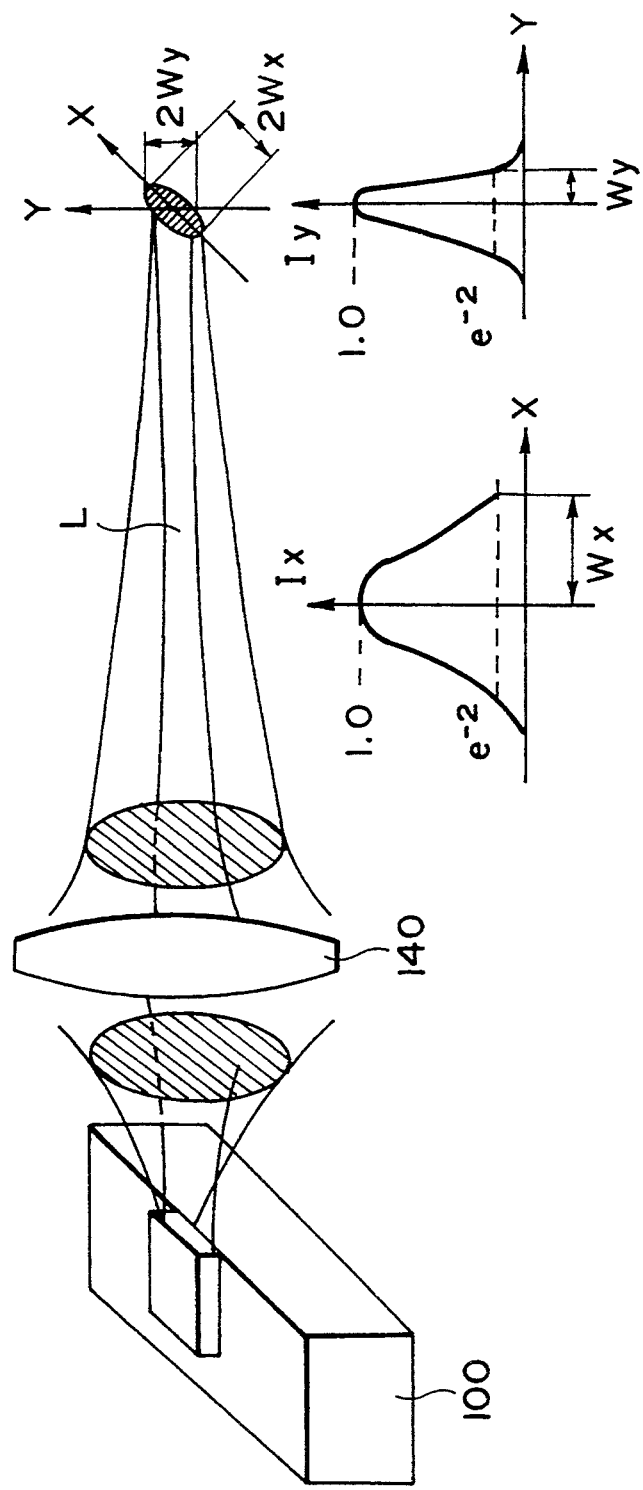
FIG. 1 is a schematic representation, for explaining a sectional intensity distribution of light as emitted by a laser.

Referring now to FIGS. 2–7, an embodiment of the present invention will be explained. In this embodiment, the invention is applied to a semiconductor device manufacturing exposure apparatus.

In the drawings, denoted at 18 is a mask which is placed on a mask stage (not shown). Denoted at 19 is a wafer which is placed on a movable wafer stage (not shown). The wafer 19 is to be exposed to a circuit pattern of the mask 18 with radiation, for manufacture of semiconductor devices.

Denoted at 1 is a light source which may comprise a coherent light source such as a semiconductor laser, a He-Ne laser, an Ar laser or the like; an incoherent light source such as a light emitting diode or a super luminescence diode (SLD), for example. Denoted at 2 is a collimator lens for transforming the light from the light source 1 into a parallel light which enters a lens system 5. The lens system 5 serves to shape the received light into a desired beam diameter and directs the same to a mirror 6. The light is reflected by the mirror 6 and goes through an X-ray window 7 (where an X-ray source is used as a light source for the lithographic exposure), and the light is incident on a positional deviation detecting autoalignment mark (hereinafter referred to as an "AA mark") 20M provided on the first object (mask) 18 as well as a surface spacing detecting autofocusing mark (hereinafter referred to as an "AF mark") 21M. The light source 1, the collimator lens 2, the lens system 5 and the mirror 6 cooperate to provide a light projecting means.

At each of four locations on scribe lines at the peripheral portion of the mask 18, the AA mark 20M and the AF mark 21M are provided. A second object (wafer) 19 is disposed in proximity to the mask 18, with a gap or spacing of 10–100 microns. The wafer has autoalignment marks (hereinafter "AA marks") 20W to be aligned with the AA marks 20M of the mask 18, and these marks are formed on scribe lines. The AA marks 20M and 20W and the AF marks 21M, each comprises a physical optic element such as, for example, a one-dimensional or two-dimensional zone plate, having a one-dimensional or two-dimensional power.

Denoted at 10 is a light receiving lens for receiving diffraction light 16 of a predetermined order or orders, from the AA mark 20M and the AF mark 21M on the mask 1 surface, and for collecting it upon the surface of a photodetector 11, which is a constituent element of light receiving means (10, 11). The light receiving element 11 comprises two line sensors (an autoalignment sensor 12 for the positional deviation detection and an autofocusing line sensor 13 for the surface spacing detection) which are provided on the same substrate.

Alignment head (pickup head) 16 is adapted to be moved along the mask 1 surface by a driving means 300. Controller 200 serves to control the drive of the alignment head 16 by the driving means 300.

Figure 3:
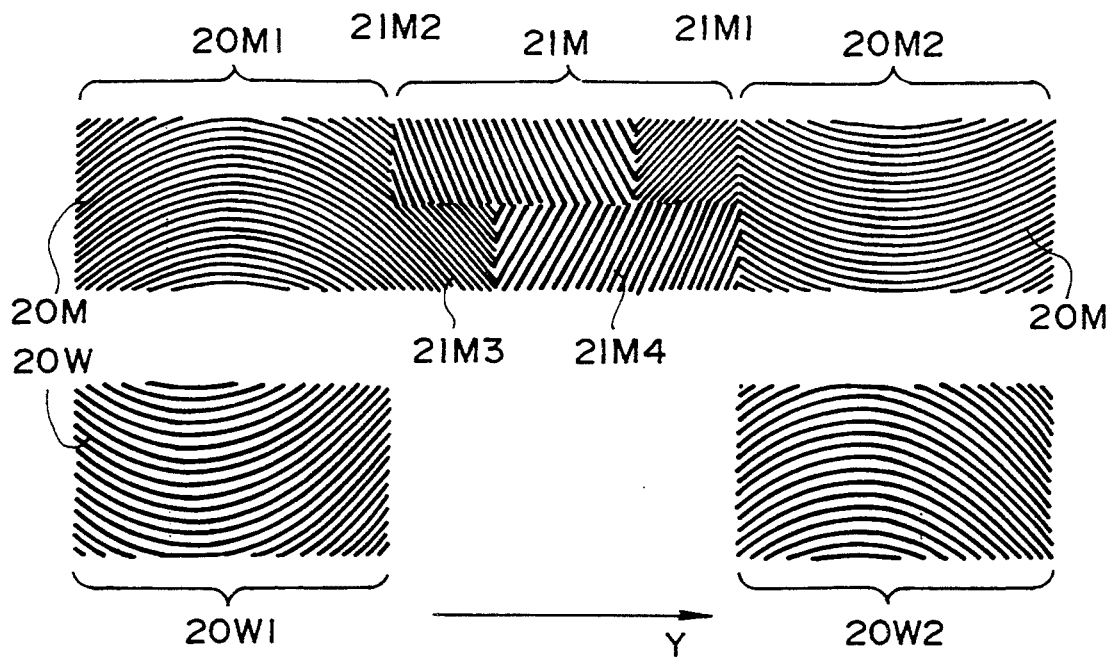
FIGS. 3 and 4 are enlarged views, respectively, for explaining a portion of FIG. 2.

FIG. 3 is an exemplary representation of AA marks 20M and 20W and an AF mark 21M, provided on the mask 18 and the wafer 19.

Figure 4:
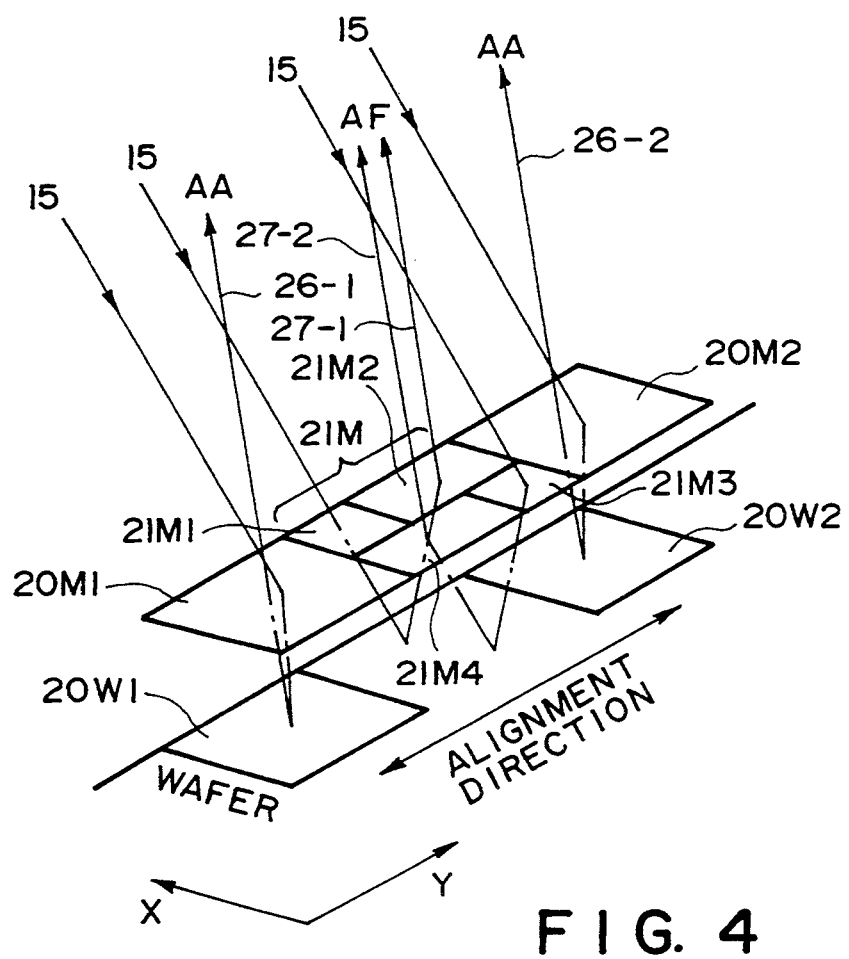

FIG. 4 illustrates the paths of lights influenced or to be influenced by the marks of the mask 18 and the wafer 19. The AA mark 20M comprises two AA marks 20M1 and 20M2, and the AA mark 20W comprises two AA marks 20W1 and 20W2. The AF mark 21M comprises two entrance side AF marks 21M1 and 21M3 as well as two exit side AF marks 21M2 and 21M4.

The wafer 19 has no AF mark, and a zero-th order reflection (regular reflection) light by the wafer surface is used.

The AA marks 20M1 and 20W1 are used in a pair, while the AA marks 20M2 and 20W2 are used in another pair. Two lights 15 are projected to the AA marks 20M1 and 20M2, respectively, and by these marks two diffraction lights (hereinafter referred to as "AA diffraction lights") 26-1 and 26-2 are produced. These AA diffraction lights are displaceable along the AA line sensor 12 surface in accordance with a positional deviation between the mask and the wafer, with respect to the alignment direction.

Also, the lights 15 are incident on the AF marks 21M1 and 21M3. Then, they are reflected by the wafer surface to the AF marks 21M2 and 21M4, respectively, whereby two diffraction lights (hereinafter referred to as "AF diffraction lights") 27-1 and 27-2 are emitted from these marks. The AF diffraction lights are displaceable along the AF line sensor 13 surface in accordance with the spacing between the mask surface and the wafer surface.

In FIG. 4, the input lights 15 are provided by the light rays of a single light beam emanating from the light source 1.

The position detecting device of this embodiment is arranged so that, after the relative position of the light projecting means (alignment head 16) and the mask 18 is detected and the positional relationship of them is adjusted by the driving means 300, the mask-to-wafer alignment operation is made. Now, the principle of positional deviation detection as well as the principle of surface spacing detection, in the present embodiment, will be explained.

First, referring to FIG. 5, the method of detecting the relative position of the mask 18 and the wafer 19 in a plane parallel to them, will be explained.

Figure 5:
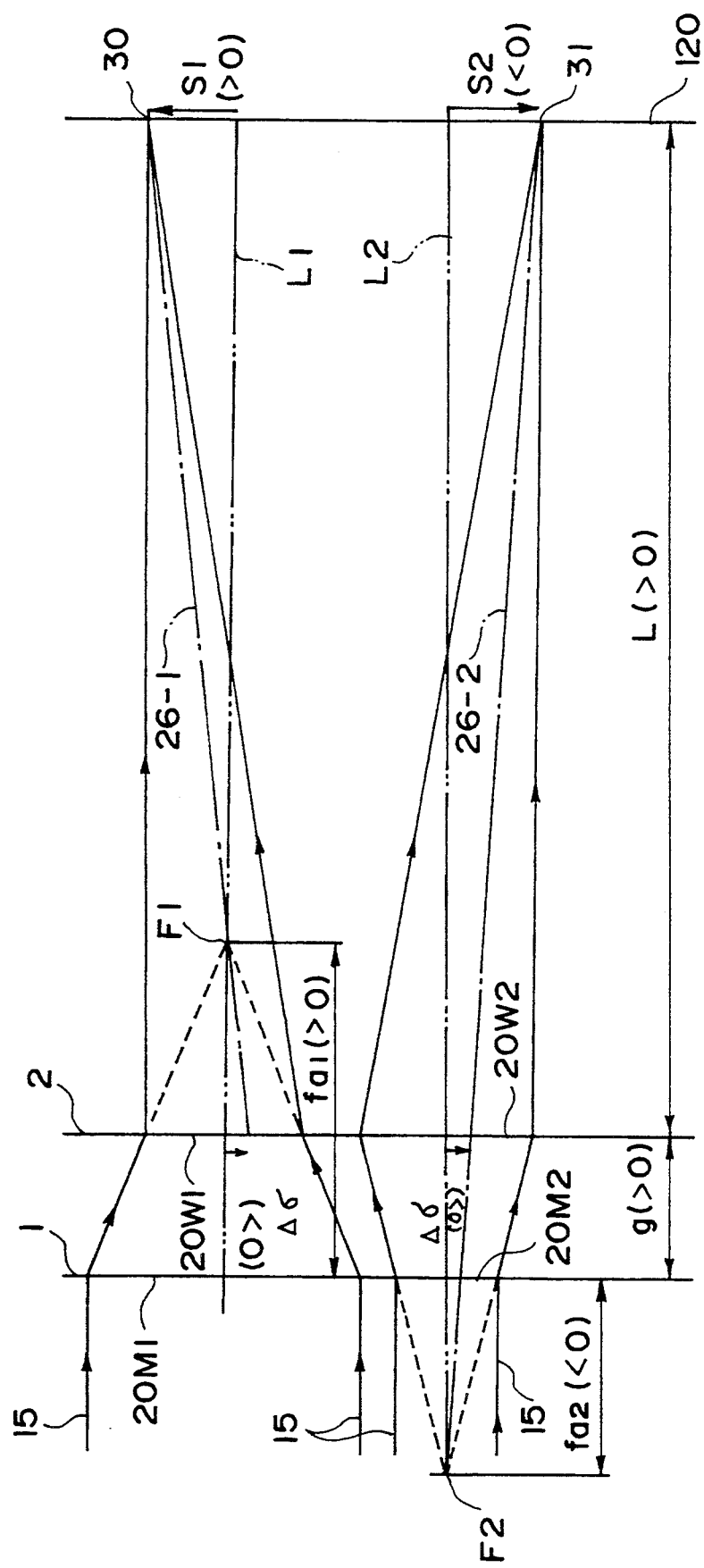
FIGS. 5 and 6 are schematic representations, respectively, for explaining the principle of positional deviation detection and the principle of surface spacing detection in the embodiment of FIG. 2.

FIG. 5 illustrates, in an extended view, the light paths as seen from a direction which is perpendicular to the position detecting direction (alignment direction) in FIG. 4 and also perpendicular to a normal to the mask 18 surface or the wafer 19 surface.

Figure 2:
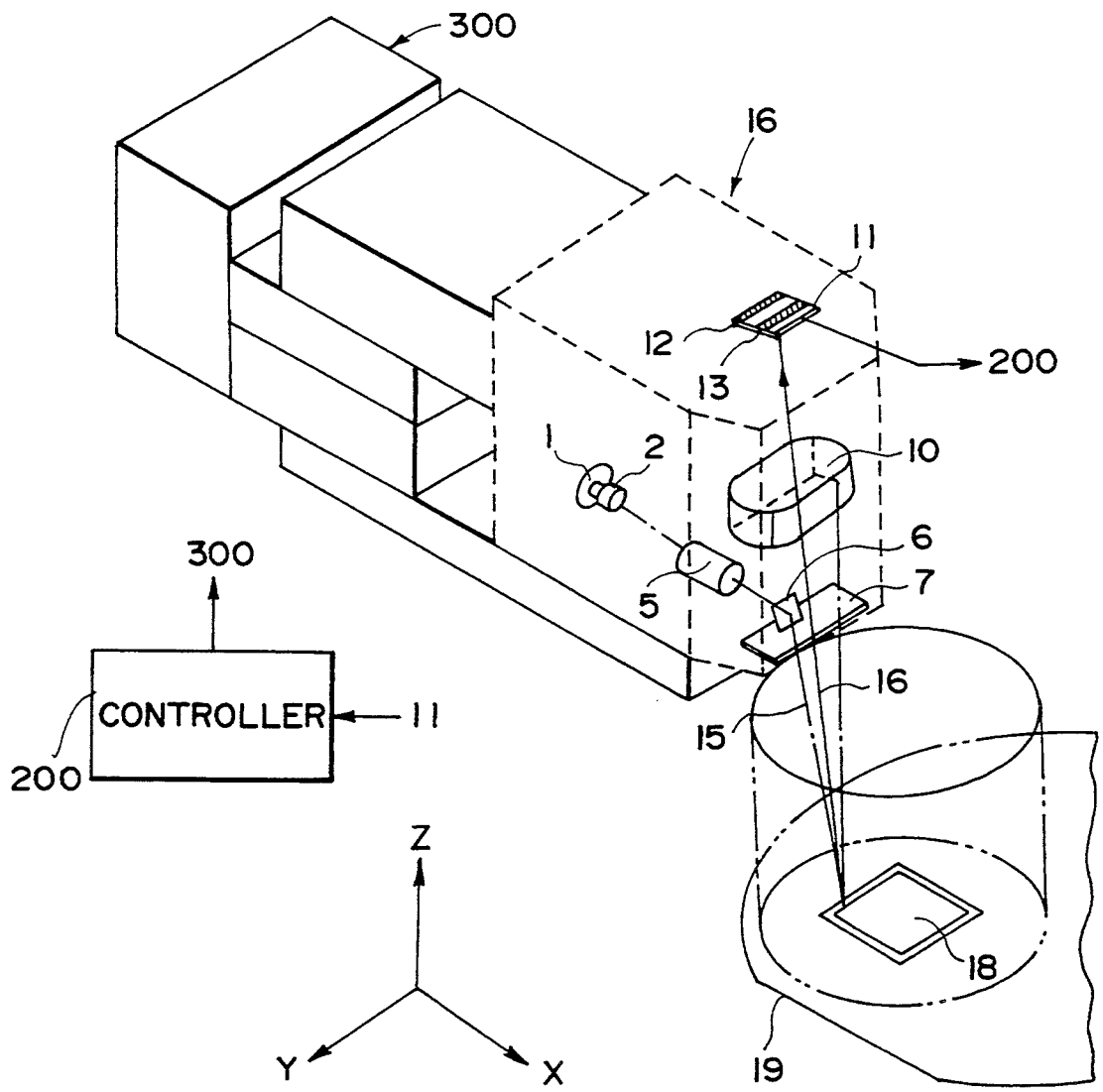
FIG. 2 is a perspective view, schematically showing a major part of an embodiment of the present invention.

In FIG. 5, like numerals as those of FIGS. 2–4 are assigned to corresponding elements. Also, while the AA mark of the wafer 19 serves to reflectively diffract an input light, in the drawing it is illustrated as an equivalent reflective diffraction mark.

The mark 20M1 is an AA mark provided on the mask 18 while the mark 20W1 is an AA mark provided on the wafer 19, each constituting a single mark for obtaining a first signal (signal light). The mark 20M2 is an AA mark provided on the mask 18 while the mark 20W2 is an AA mark provided on the wafer 19, each constituting a single mark for obtaining a second signal (signal light). Denoted at 26-1 and 26-2 are AA diffraction lights, representing the first and second signal lights. Denoted at 120 is a primary focal plane which is optically conjugate with the light receiving element 11 with respect to the light receiving lens 10.

It is now assumed that the distance from the wafer 19 to the primary focal plane 120 is L; the spacing between the mask 18 and the wafer 19 is g; the focal lengths of the AA marks 20M1 and 20M2 are $f_{a1}$ and $f_{a2}$; the relative positional deviation between the mask 18 and the wafer 19 is $\Delta\sigma$; and the displacements of the first and second signal lights (AA diffraction lights) 26-1 and 26-2, at this time, are S1 and S2, respectively.

For convenience, the light 15 incident on the mask 18 comprises a plane wave, and the sign is such as illustrated. The displacements S1 and S2 of the gravity centers of the signal lights (AA diffraction lights) 26-1 and 26-2, each can be determined geometrically as a deviation of an optical axis L1 (L2) from the intersection between the primary focal plane 32 and a straight line that connects the focal point F1 (F2) of the AA mark 20M1 (20M2) and the center of the AA mark 20W1 (20W2), corresponding to the top of a lens. Therefore, in order that, for a relative positional deviation between the mask and the wafer, the displacements S1 and S2 of the gravity centers of the signal lights (AA diffraction lights) 26-1 and 26-2 are produced in opposite directions, the optical imaging magnifications of the AA marks 20W1 and 20W2 are set with opposite signs.

Quantitatively, the displacements can be represented as follows:

$$S1 = -[(L-f_{a1}+g)/(f_{a1}-g)]\Delta\sigma$$

$$S2 = -[(L-f_{a2}+g)/(f_{a2}-g)]\Delta\sigma$$

The deviation magnifications can be defined as $\beta_1 = S1/\Delta\sigma$ and $\beta_2 = S2/\Delta\sigma$. Therefore, for providing deviation magnifications of opposite signs, the following relation can be satisfied:

$$[(L-f_{a1}+g)(f_{a2}-g)]/[(L-f_{a2}g)(f_{a1}-g)] < 0$$

With regard to this relation, there is one practically suitable structural condition such as follows:

$$L >> |f_{a1}|$$

$$f_{a1}/f_{a2} < 0$$

$$|f_{a1}| > g$$

$$|f_{a2}| > g$$

Namely, it is a structure wherein, to the focal lengths $f_{a1}$ and $f_{a2}$ of the AA marks 20M1 and 20M2, the distance L to the primary focal plane 120 is made large, while the spacing g between the mask and the wafer is made small and, additionally, one of the AA marks is provided by a convex lens while the other is provided by a concave lens.

In the upper half of FIG. 5, the AA mark 20M1 transforms a received light into a convergent light being influenced by a positive optical power, which light, before reaching its focal point F1, impinges upon the AA mark 20W1. By a negative power of the AA mark 20W, the light is then imaged upon the primary focal plane 120. The focal length $f_{b1}$ of the AA mark 20W1 is determined so as to satisfy the following lens equation:

$$1/(f_{a1}-g) + 1/L = -1/f_{b1}$$

Similarly, in the lower half of FIG. 5, the AA mark 20M2 transforms a received light into a divergent light being influenced by a negative optical power, diverging from a point F2 at the entrance side, and the light is imaged by a positive power of the AA mark 20W2 upon the primary focal plane 120. The focal length $f_{b2}$ of the AA mark 20W2 is determined so as to satisfy the following relation:

$$1/(f_{a2}-g) + 1/L = -1/f_{b2}$$

Under the structural conditions as described above, clearly from the drawing the imaging magnification of the AA mark 20W1 to the point image (virtual image) by the AA mark 20M1 is positive. Thus, the deviation $\Delta\sigma$ of the wafer 19 and the displacement S1 of the spot of light upon the primary focal plane 120 are in opposite directions and, thus, the deviation magnification $\beta_1$ as defined hereinbefore is negative. Similarly, the imaging magnification of the AA mark 20W2 to the point image (virtual image) by the AA mark 20M2 is negative, and the deviation $\Delta\sigma$ of the wafer 19 and the displacement S2 of the spot of light upon the primary focal plane 120 are in the same direction. Thus, the deviation magnification $\beta_2$ is positive.

As a result, for a relative positional deviation $\Delta\sigma$ of the mask 18 and the wafer 19, the displacements S1 and S2 of the AA diffraction lights (signal lights) 26-1 and 26-2 from a system comprising the AA marks 20M1 and 20W1 and a system comprising the AA marks 20M2 and 20W2, are in opposite directions. Namely, the distance between the light spot 30 as formed on the primary focal plane 120 by the diffraction through the grating patterns of the AA marks 20M1 and 20W1 and the light spot 31 as formed on the primary focal plane 120 by the diffraction through the grating patterns of the AA marks 20M2 and 20W2, changes with the quantity of positional deviation between the mask 1 and the wafer 19. These two light spots 30 and 31 are projected by the light receiving lens 10 upon the surface of the AA line sensor 12 of the light receiving means 11. Then, the spacing between the two light spots (light images) 30 and 31 is detected through the AA line sensor 312, whereby the relative positional deviation between the mask 18 and the wafer 19 is determined.

Figure 7:
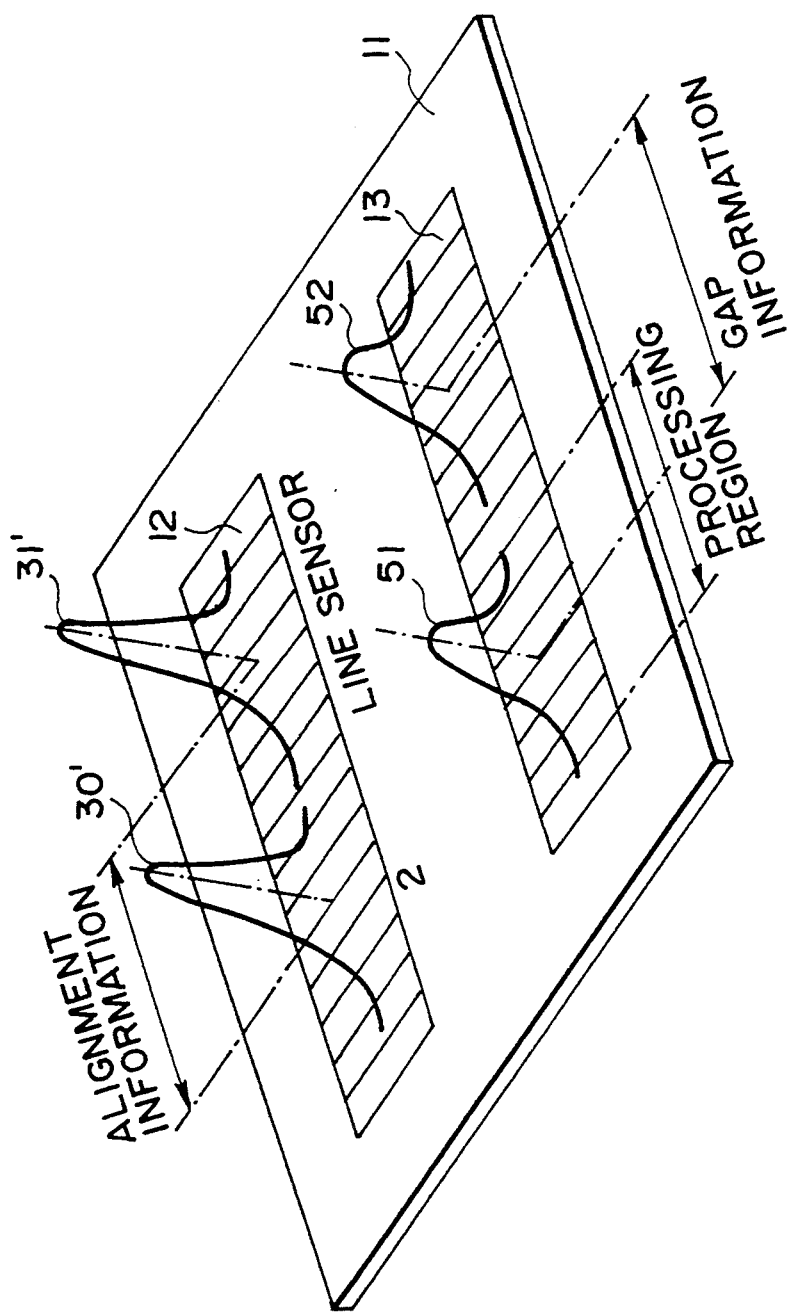
FIG. 7 is a schematic representation, for explaining a sensor of FIG. 2.

FIG. 7 is a schematic representation, showing two light spots (light images) 30' and 31', formed on the sensor 12 surface.

In the present embodiment, even if the wafer 19 is tilted relative to the mask 18, the two light spot images 30' and 31' displace along the primary focal plane 120, in the same direction and by the same amount. Therefore, the spacing of these light spot images is unchanged and, as a result, any inclination does not cause a detection error.

Figure 6:
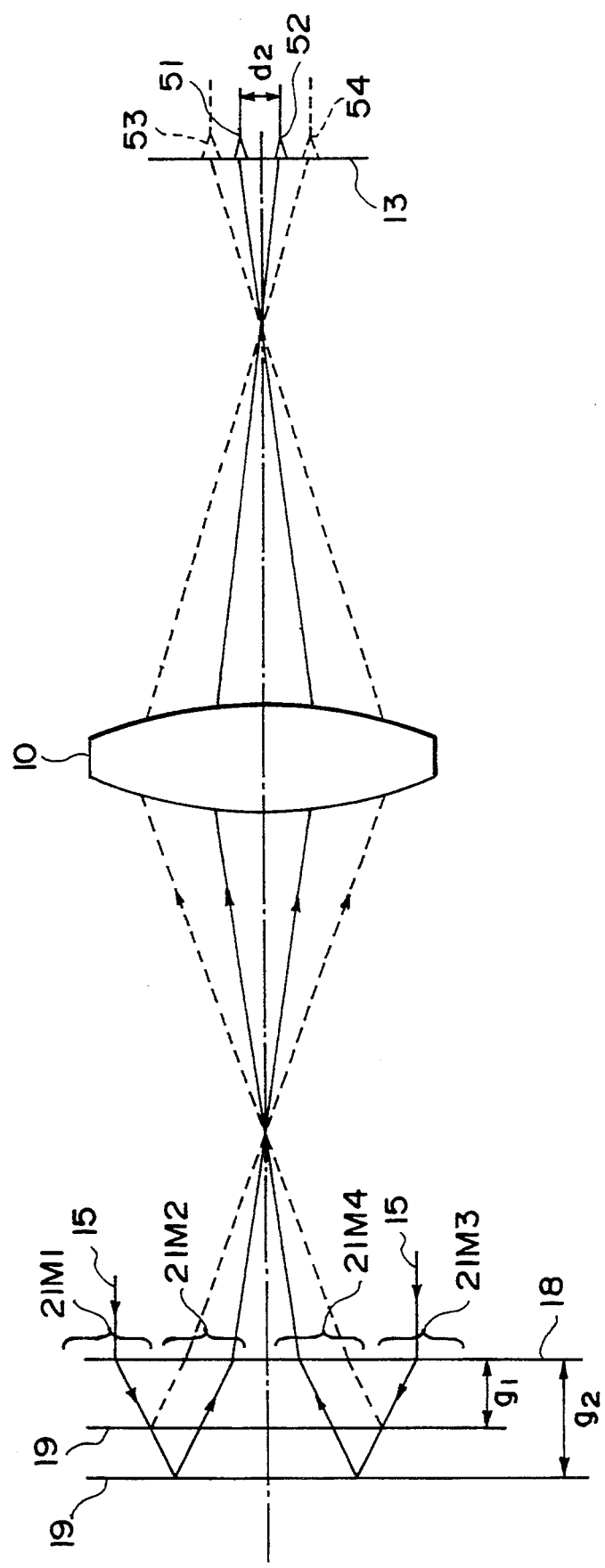

Next, the method of detecting the surface interval between the mask 18 and the wafer 19, will be explained in conjunction with FIG. 6. In the drawing, like numerals as of those of FIGS. 2–4 are assigned to corresponding elements.

In this example, input light 15 is incident on two AF marks 21M1 and 21M3 provided on the mask 18 surface. Here, the light incident on the AF mark 21M1 (21M3) is diffracted thereby and, as an example, a first order diffraction light is obliquely incident on the wafer 19 surface and is regularly reflected by the wafer 19 surface, which is spaced from the mask 18 by a certain gap or spacing, and then it is incident on an AF mark 21M2

(21M4) provided on the mask 18 surface. The AF mark 21M2 (21M4) comprises a zone plate pattern having a light converging function like that of a lens. Additionally, it has an optical function with which, as the light reflected by the wafer 19 is incident on the AF mark 21M2 (21M4), the angle of emission of the emanating diffraction light from the mark 21M2 (21M4) changes with the position of incidence (i.e. the pupil position of the grating area).

If, for example, the surface interval between the mask 18 and the wafer 19 is $g_2$, the AF diffraction lights (third and fourth signal lights) having been diffracted by the AF marks, advance along the paths as depicted by solid lines and go through the light receiving lens 10, whereby two light spots 51 and S1 are formed on an AF line sensor 13 surface. If, on the other hand, the surface interval is $g_1$, the AF diffraction lights (third and fourth signal lights) diffracted by the AF marks, advance along the paths as depicted by broken lines, and two light spots 53 and 54 are formed on the AF line sensor 13 surface.

FIG. 7 is a schematic representation, showing the two light spots 51 and 52 as formed on the sensor 13 surface.

In this manner, in accordance with the surface interval between the mask 18 and the wafer 19, the spacing between the two light spots as formed on the AF line sensor 13 surface changes. Thus, by measuring the spacing of the two light spots, the surface interval of the mask 18 and the wafer 19 can be detected.

Next, description will be made on the principle of detection of the relative position of the alignment head (light projecting means) and the mask 18 (first object), which is an important feature of the present embodiment.

First, the manner of causing the light from the light projecting means to be accurately incident on the mask at a position within a predetermined range with respect to the position detecting direction (alignment direction), i.e. the Y-axis direction, in this example, will be explained.

To this end, the lights (diffraction lights) 26-1 and 26-2 influenced by the position detecting AA marks 20M and 20W are used. In this embodiment, the area of opening, for example, of each of paired AA marks 20M1 and 20M2 of the mask 18 and paired AA marks 20W1 and 20W2 of the wafer is so set that, when the center of the light from the alignment head 16 with respect to the Y-axis direction is positioned at the middle point between the paired AA marks 20M1 and 20M2 (in this example, at the middle of the AF mark 21M), the two light beams 26-1 and 26-2 produced on the surface of the line sensor 12 have substantially the same light quantity distribution (with respect to the shape of the distribution or the integrated light quantity, for example).

Thus, in this embodiment, the alignment head 16 is displaced to adjust its position to thereby adjust the position of incidence of the light beam 15 upon the mask 18, so as to assure that, as best seen in FIG. 7, of the light from the light projecting means, the light beam 26-1 influenced by the AA mark 20M1 on the mask 18 surface and by the AA mark 20W1 on the wafer 19 surface and the light beam 26-2 influenced by the AA mark 20M2 on the mask 18 surface and by the AA mark 20W2 on the wafer 19 surface provide such light quantity distributions on the line sensor 12 surface which are substantially equal to each other in integrated level.

In this manner, on the line sensor 12 surface, the light quantity distributions of the two light beams 26-1 and 26-2, of substantially the same integrated level, are assured and thus the positioning of the light projecting means (i.e. the light 15) with respect to the autoalignment (AA) direction is accomplished.

Actually, however, even if the AA marks 20M1 and 20M2 have the same area of opening and even if the AA marks 20W1 and 20W2 have the same area opening, due to a difference in design between the left-hand and right-hand marks there is a case wherein the light quantity is eclipsed and thus a difference in light quantity is produced between the two light beams 26-1 and 26-2. In such a case, however, as regards the quantity which can be predetected from the design, such a predetected component may be taken into account beforehand and balancing of the light quantity may be assured in the manner such as, for example, described below.

In the case of this embodiment, as seen in FIG. 5, AA marks 20M1 and 20M2 having the same area of opening are provided on the mask 18 surface. Here, if AA marks 20W1 and 20W2 each of the same size as the AA mark of the mask are provided on the wafer 19 surface, then, since the AA mark 20M1 has a convex lens function of a focal length $f_{a1}>0$, all the diffraction lights are incident on the AA mark 20W1.

On the other hand, since the AA mark 20M2 has a concave lens function of a focal length $f_{a2}>0$, the diffraction light is directed to the AA mark 20W2 while being expanded. Therefore, such a portion of the light quantity which is expanded beyond the mark size is eclipsed.

Assuming that a plane wave is incident on the AA mark 20M2, the quantity being eclipsed can be determined by the mark sizes $l_{M2}$ and $l_{W2}$ of the AA marks 20M2 and 20W2, the power of the AA mark 20M2 and the surface interval (magnitude of gap) g of the AA marks 20M2 and 20W2. Thus, this quantity may be calculated by quantitative analysis and may be taken into account when the light quantity distributions of the light beams 26-1 and 26-2 are compared with each other.

When each AA mark has a lens function only within the plane of the sheet of FIG. 5 and not in the direction perpendicular to the sheet of the drawing, that is, a cylindrical lens function, the quantity of effective light of the AA mark 20W2 is equal to "K" times the quantity of light incident on the AA mark 20M2, wherein K can be expressed by:

$$K = l_{W2}/\{l_{M2} \times [(-f_{a2}+g)/-f_{a2}]\}$$

In consideration thereof, it may be well to increase the light quantity of diffraction light from the AA mark 20M1 and 20W1, by "K" times.

On the basis of the balancing of the integrated light quantities of the two light beams 26-1 and 26-2 on the line sensor 12 surface as described, the positioning in the autoalignment direction of the light 15 projected from the light projecting means can be accomplished.

As an alternative, in place of balancing the integrated light quantities, the structure may be arranged so that the light 15 is so positioned that the two light beams 26-1 and 26-2 have light quantity distributions of geometrically similar or symmetrical shape.

Next, the manner of causing the light from the light projecting means to be accurately projected within a predetermined range in a direction (X-axis direction)

perpendicular to the autoalignment direction, will be explained. To this end, the surface interval detecting light beams 27-1 and 27-2 are used. In other words, the AF marks 21M1–21M4 are used.

In this embodiment, the area of opening of each paired AF marks 21M1 and 21M2 and paired AF marks 21M3 and 21M4 is so set that, when the center of the light 15 from the alignment head 16 with respect to the X-axis direction is incident on a position on or adjacent to the boundary line between the set of AF marks 21M1 and 21M2 and the set of AF marks 21M3 and 21M4, the two light beams 27-1 and 27-2 produced on the line sensor 13 surface have substantially the same light quantity distribution (with respect to the shape of the distribution or the integrated light quantity, for example).

Thus, in this embodiment, the alignment head 16 is displaced so as to assure that, as best seen in FIG. 7, of the light from the light projecting means, the light beam 27-1 influenced by the paired AF marks 21M1 and 21M2 and the light beam influenced by the paired AF marks 21M3 and 21M4 both impinging on the line sensor 13 have substantially the same light quantity distribution, and, by this, the adjustment of the position in the X-axis direction of incidence of the light 15 upon the mask is accomplished.

While in this embodiment two marks (AF marks or AF marks) having the same area of opening are used and comparison is made to the light quantity distributions of them upon the line sensor surface, these marks may have different areas of opening or different shapes of opening, for example, if the two marks are so set that, when the light is incident on a middle of the two marks (in the case of AA marks, a middle position between the AA marks 20M1 and 20M2; while in the case of AF marks, a middle position between the AF marks 21M1 and 21M3), a predetermined relationship is established between the light quantity distributions of the two light beams (light beams 26-1 and 26-2 or light beams 27-1 and 27-2).

Further, as regards the light 15 from the light projecting means (alignment head 16), such a light as having a symmetrical intensity distribution with respect to both the autoalignment direction (Y-axis direction) and the direction (X-axis direction) perpendicular thereto, is used in this embodiment. However, a light of non-symmetrical intensity distribution may be used provided that the intensity distribution is predetected or predetermined.

As an alternative, the structure may be so arranged that, when the light 15 is correctly incident on a predetermined position of the mask 18, the two light beams provide light quantity distributions having substantially the same peak level or having substantially the same half width. On that occasion, the positioning of the light from the light projecting means may be accomplished by comparison made to the peak levels or half widths of the light quantity distributions of the two light beams.

Next, the manner of effecting high efficiency and high precision alignment operation and surface interval (gap) measurement operation, based on four spots (30, 31, 51 and 52) formed on the light receiving means 11 surface, in accordance with the present embodiment, will be explained.

First, with relatively rough precision, the light 15 from the light projecting means (alignment head 16) is relatively aligned with the mask 18 and, then, the light 15 is projected on the AA mark 20M and the AF mark 21M on the mask 18 surface.

Subsequently, an output signal from the line sensor 13, which corresponds to two light patterns formed on the line sensor 13 by the AF marks 21M1–21M4, is applied to the controller 200 and, by this controller, the surface interval between the mask and the wafer is effected. Then, the wafer stage (not shown) is actuated on the basis of this measurement to thereby adjust the surface interval to a degree allowing the alignment measurement.

After this, an output signal of the line sensor 12 which corresponds to two light patterns formed on the line sensor 12 by the AA marks 20M1, 20M2, 20W1 and 20W2, is applied to the controller 200 and, by this controller, alignment measurement with a relatively rough precision is effected. Then, while comparing the integrated light quantities of the paired light beams 26-1 and 26-2 with each other and, additionally, comparing the integrated light quantities of the paired light beams 27-1 and 27-1 with each other, the positioning of the projected light 15 upon the mask 18 surface is carried out so as to assure that in each pair the light beams provide substantially the same integrated light quantity.

When this is accomplished, an error component of each of the alignment measurement and the surface interval measurement, due to a deviation of the projected light, is minimum. Thus, high precision alignment measurement and high precision surface interval measurement through the alignment head 16, in the succeeding step, are assured. As a result, the mask-to-wafer alignment as well as the gap adjustment of the mask and the wafer can be made extraordinarily precisely.

Another embodiment of the present invention will now be described. In this embodiment, the relative position of the light projecting means (alignment head 16) and the first object (mask 18) is detected by using the AF mark, only.

More specifically, in this embodiment, the alignment head 16 (light 15) is scanningly shifted by the driving means 300 in the alignment direction (Y-axis direction, in this example), so as to detect such a point $y_1$ (the position of incidence of the light 15) at which the sum of the integrated light quantities of two light beams 27-1$a$ and 27-2$a$ formed on the line sensor 13 surface shows a peak.

Subsequently, while fixing the position of incidence of the light 15 from the alignment head 16 at the point $y_1$ with respect to the Y-axis direction, the alignment head 16 is scanningly shifted again but in the X-axis direction so as to detect such a point $x_1$ at which the sum of the integrated light quantities of two light beams 27-1$a$ and 27-2$a$ formed on the line sensor 13 surface shows a peak.

The above-described sequential operations are repeated until quantities $x_n - x_{n-1}$ and $y_n - y_{n-1}$ (wherein n=1, 2, 3, ... ) become sufficiently small, and the coordinate $(x_n, y_n)$ at the moment when these quantities reach respective tolerable levels which are predetermined, is used as the coordinate for the light 15 correctly positioned.

A further embodiment of the present invention will now be described. In this embodiment, the relative positioning of the light projecting means (alignment head 16) and the mask 18 may be accomplished by using a pair of first physical optic elements (such as marks 20M1 and 20M2 in FIG. 9, to be described) and a pair of second physical optic elements (such as marks 71M1 and 71M2 in FIG. 9, to be described) which may be formed as AA marks in the autoalignment direction and in a direction perpendicular thereto. An example of such a second pair of physical optic elements are illustrated in FIG. 8, and their light paths are illustrated in FIG. 9.

In FIG. 8, denoted at 71M are a pair of physical optic elements provided on the surface of a mask 18, which comprise two AA marks 71M1 and 71M2 each having an optical power. On the other hand, a wafer 19 has formed on its surface a pair of physical optic elements 71W which comprise two AA marks 71W1 and 71W2 each having an optical power.

The positioning with regard to the position of incidence of the projected light 15 may be made by using the AA marks 71M and 71W and by using AA marks 20M1, 20M2, 20W1 and 20W2 such as those shown in FIG. 3. This is done in the following manner.

As a first example, description will be made of a case wherein the AA mark 71M shown in FIG. 8 is provided in the region for the AF mark 21M of FIG. 3, in place therefor, while the AA mark 71W is provided in the region between the AA marks 20W1 and 21W2 on the wafer surface of FIG. 3, so that the resultant arrangement is such as shown in FIG. 9.

When the specifications of the marks 20M1, 20W1; and 20M2, 20W2 are not changed, signals (light beams) from these marks reach on the line sensor 12 at 30 and 31. On the other hand, two light beams from the marks 71M1, 71W1; and 71M2, 71W2 reach the sensor 13 at 51 and 52, such that overlapping of light beams upon the sensor means is prevented. Any positional deviation of the light 15 with respect to the alignment direction can be detected by comparing the light quantity distributions at 30 and 31 and, on the other hand, any positional deviation thereof with respect to the direction perpendicular to the alignment direction can be detected by comparing the light quantity distributions at 50 and 51. Such deviation detection can be done in essentially the same manner as having been described with reference to the first embodiment.

As a second example, description will be made of a case wherein the AA mark 20M (20W) and the AA mark 71M (71W) are spaced from each other.

In this case, the positioning of the projected light 15 in the autoalignment direction may be accomplished essentially in the same manner as described with reference to the first embodiment. After this, the alignment head 16 is displaced to shift the projected light 15 to the position of the AA mark 71M (71W), and, by using the AA marks 71M and 71W, the positioning of the projected light 15 with respect to the direction perpendicular to the autoalignment direction may be executed. By this, it is possible to assure suitable setting of the position of incidence on the mask 18 of the light 15 projected from the light projecting means (alignment head 16).

In accordance with these embodiments of the present invention, by using alignment marks of first and second object which marks are provided for detection of the relative position of the first and second objects, light from a light projecting means (alignment head) can be relatively positioned with respect to the first object. This effectively avoids complicatedness of the mark arrangement of the first object and, on the other hand, assures precise impingement of the light from the light projecting means (alignment head) upon a predetermined region of the alignment mark. Thus, high precision detection of the relative position of the first and second objects is ensured.

The present invention is applicable to other types of alignment systems. An example is one disclosed in Japanese Laid-Open Patent Application No. 62-261003 wherein a mask and a wafer are provided with diffraction gratings. If, in this case, a light beam is not correctly incident on the diffraction gratings of the mask and the wafer, due to wavefront aberration produced by a cylindrical lens, for example, of an optical system used, there occurs a positioning error. Thus, in this example, for the accurate positioning of the input light beam with respect to the alignment direction, an amplitude of a beat signal obtainable from a pair of diffraction beams from the mask mark may be monitored and the relative positioning of the input beam with the mask may be done so that the monitored amplitude becomes maximum.

While the invention has been described with reference to the structures disclosed herein, it is not confined to the details set forth and this application is intended to cover such modifications or changes as may come within the purposes of the improvements or the scope of the following claims.

What is claimed is:

1. In a method of detecting a positional deviation between a mask with first and second patterns each having an optical power and a wafer with first and second marks each having an optical power, wherein a radiation beam having a predetermined intensity distribution is projected from an optical head to the mask such that a first beam influenced by the optical power of the first pattern and that of the first mark and a second beam influenced by the optical power of the second pattern and that of the second mark are produced and wherein the positional deviation is determined on the basis of a positional relationship between the first and second beams upon a predetermined plane, the improvement comprising the steps of:

comparing intensity distributions of the first and second beams upon the predetermined plane with each other to detect a deviation of the position of incidence of the radiation beam upon the mask from a predetermined position;

relatively positioning the radiation beam and the mask for correcting the detected deviation; and determining the positional deviation of the mask and the wafer on the basis of the positional relationship between the first and second beams upon the predetermined plane.

2. A method according to claim 1, further comprising comparing the first and second beams with each other with respect to the shape of their intensity distributions to thereby detect the deviation of the position of incidence, and relatively positioning the radiation beam to provide one of geometrically similar and symmetrical intensity distributions of the first and second beams.

3. A method according to claim 1, further comprising comparing the first and second beams with each other with respect to an integrated intensity of the intensity distribution to thereby detect the deviation of the position of incidence, and relatively positioning the radiation beam to provide a predetermined ratio to the integrated intensities of the first and second beams.

4. In a method of detecting a spacing between a mask and a wafer, wherein the mask has first and second patterns each having an optical power, wherein a radiation beam having a predetermined intensity distribution is projected from an optical head obliquely to a surface of the wafer through the mask such that a first beam reflected by the wafer and influenced by the optical power of the first pattern and a second beam reflected by the wafer and influenced by the optical power of the second pattern are produced and wherein the spacing of the mask and the wafer is determined on the basis of a positional relationship between the first and second beams upon a predetermined plane, the improvement comprising the steps of:

comparing intensity distributions of the first and second beams upon the predetermined plane with each other to detect a deviation of the position of incidence of the radiation beam upon the mask from a predetermined position;

relatively positioning the radiation beam and the mask for correcting the detected deviation; and determining the spacing of the mask and the wafer on the basis of the positional relationship between the first and second beams upon the predetermined plane.

5. A method according to claim 4, further comprising comparing the first and second beams with each other with respect to the shape of their intensity distributions to thereby detect the deviation of the position of incidence, and relatively positioning the radiation beam to provide one of geometrically similar and symmetrical intensity distributions of the first and second beams.

6. A method according to claim 4, further comprising comparing the first and second beams with each other with respect to an integrated intensity of the intensity distribution to thereby detect the deviation of the position of incidence, and relatively positioning the radiation beam to provide a predetermined ratio to the integrated intensities of the first and second beams.

7. In a semiconductor device manufacturing method usable with a mask and a wafer, wherein the mask is formed with a circuit pattern and with first and second patterns each having an optical power, the wafer is formed with first and second marks each having an optical power, a radiation beam having a predetermined intensity distribution is projected from an optical head to the mask such that a first beam influenced by the optical power of the first pattern and that of the first mark and a second beam influenced by the optical power of the second pattern and that of the second mark are produced, a positional deviation between the mask and the wafer is determined on the basis of a positional relationship between the first and second beams upon a predetermined plane, and after relatively positioning the mask and the wafer on the basis of the determination the wafer is exposed to the circuit pattern of the mask, the improvement comprising the steps of:

comparing intensity distributions of the first and second beams upon the predetermined plane with each other to detect a deviation of the position of incidence of the radiation beam upon the mask from a predetermined position;

relatively positioning the radiation beam and the mask for correcting the detected deviation; and determining the positional deviation of the mask and the wafer on the basis of the positional relationship between the first and second beams upon the predetermined plane.

8. In a semiconductor device manufacturing method usable with a mask and a wafer, wherein the mask is formed with a circuit pattern and with first and second patterns each having an optical power, a radiation beam having a predetermined intensity distribution is projected from an optical head obliquely to a surface of the wafer through the mask such that a first beam reflected by the wafer and influenced by the optical power of the first pattern and a second beam reflected by the wafer and influenced by the optical power of the second pattern are produced, a spacing between the mask and the wafer is determined on the basis of a positional relationship between the first and second beams upon a predetermined plane, and after adjusting the spacing the wafer is exposed to the circuit pattern of the mask, the improvement comprising the steps of:

comparing intensity distributions of the first and second beams upon the predetermined plane with each other to detect a deviation of the position of incidence of the radiation beam upon the mask from a predetermined position;

relatively positioning the radiation beam and the mask for correcting the detected deviation; and determining the spacing of the mask and the wafer on the basis of the positional relationship between the first and second beams upon the predetermined plane.

9. In a method of detecting a positional deviation between a mask and a wafer, wherein a radiation beam having a predetermined intensity distribution is projected to an alignment pattern of the mask whereby a signal beam is produced, and the positional deviation of the mask and the wafer is determined on the basis of the signal beam, the improvement comprising the steps of:

detecting a deviation of the position of incidence of the radiation beam upon the mask from a predetermined position, on the basis of the signal beam;

relatively positioning the radiation beam and the mask for correcting the detected deviation; and determining the positional deviation of the mask and the wafer on the basis of the position of incidence of the signal beam upon a predetermined plane.

10. A method according to claim 9, further comprising detecting the deviation of the position of incidence on the basis of the intensity of the signal beam.

11. A method according to claim 9, further comprising detecting the deviation of the position of incidence on the basis of the intensity distribution of the signal beam.

12. In a semiconductor device manufacturing method usable with a mask and a wafer, wherein a radiation beam having a predetermined intensity distribution is projected to an alignment pattern of the mask whereby a signal beam is produced, the positional deviation of the mask and the wafer is determined on the basis of the signal beam, and after correcting the positional deviation the wafer is exposed to a circuit pattern of the mask for manufacture of a semiconductor device, the improvement comprising the steps of:

detecting a deviation of the position of incidence of the radiation beam upon the mask from a predetermined position, on the basis of the signal beam;

relatively positioning the radiation beam and the mask for correcting the detected deviation; and determining the positional deviation of the mask and the wafer on the basis of the position of incidence of the signal beam upon a predetermined plane.

* * * * *